United States Patent [19]

Deutscher et al.

[11] 4,255,208
[45] Mar. 10, 1981

[54] METHOD OF PRODUCING MONOCRYSTALLINE SEMICONDUCTOR FILMS UTILIZING AN INTERMEDIATE WATER DISSOLVABLE SALT LAYER

[75] Inventors: Siegfried G. Deutscher, Herzlia; Enrique Grunbaum, Kfar Saba, both of Israel

[73] Assignee: Ramot University Authority for Applied Research and Industrial Development Ltd., Tel Aviv, Israel

[21] Appl. No.: 42,423

[22] Filed: May 25, 1979

[51] Int. Cl.³ ................ H01L 21/203; H01L 21/306
[52] U.S. Cl. ........................... 148/175; 29/572; 148/1.5; 148/174; 156/610; 156/612; 156/DIG. 88; 156/657; 156/155
[58] Field of Search .............. 148/1.5, 174, 175; 156/610, 612, DIG. 64, DIG. 67, DIG. 88, 655, 656, 657, 155, 344; 29/572; 427/74, 86, 248 J, 255, 337

[56] References Cited

U.S. PATENT DOCUMENTS

| | | | |
|---|---|---|---|
| 3,158,511 | 11/1964 | Robillard | 148/1.5 X |
| 3,186,880 | 6/1965 | Skaggs et al. | 148/175 X |
| 3,370,980 | 2/1968 | Anderson | 148/175 X |
| 3,382,099 | 5/1968 | Montmory | 156/610 |
| 3,900,943 | 8/1975 | Sirtl et al. | 148/174 X |
| 3,914,856 | 10/1975 | Fang | 29/572 |
| 3,993,533 | 11/1976 | Milnes et al. | 427/74 X |
| 4,116,751 | 9/1978 | Zaromb | 148/175 X |
| 4,152,535 | 5/1979 | Deminet et al. | 148/1.5 X |
| 4,159,354 | 6/1979 | Milnes et al. | 148/175 X |

OTHER PUBLICATIONS

Newman, R. C., "Review of Growth . . . Germanium and Silicon" Microelectronics, vol. 3, 1964, pp. 121-138.
Finne et al., "Water-Amine-Complexing Agent for Etching Silicon" J. Electrochem. Soc., vol. 114, No. 9, Sep. 1967, pp. 965-970.
Milnes et al., "Peeled Film Technology for Solar Cells" Conf. Record, 11th IEEE Photospecialists Conf., May 1975, pp. 338-341.
Cherry, W. R., "Large Area Sola Cells" Proc. 13th Power Sources Conf. (Apr. 1959), pp. 62-66.

*Primary Examiner*—R. Dean
*Assistant Examiner*—W. G. Saba
*Attorney, Agent, or Firm*—Benjamin J. Barish

[57] ABSTRACT

A method is described for producing semiconductor films, particularly monocrystalline silicon and germanium films, characterized by the steps of: epitaxially growing on a substrate, such as silicon or sapphire, a layer of dissolvable material, such as sodium fluoride, sodium chloride, or silver; epitaxially growing on the dissolvable layer a layer of the semiconductor; and dissolving the dissolvable layer, thereby separating the semiconductor from the substrate. The substrate may thus be reused as a matrix for growing many such films. Also a plurality of semiconductor layers may be epitaxially grown on a common substrate each separated by a dissolvable layer, all the latter layers being dissolved at one time to produce a plurality of the semiconductor films.

18 Claims, 2 Drawing Figures

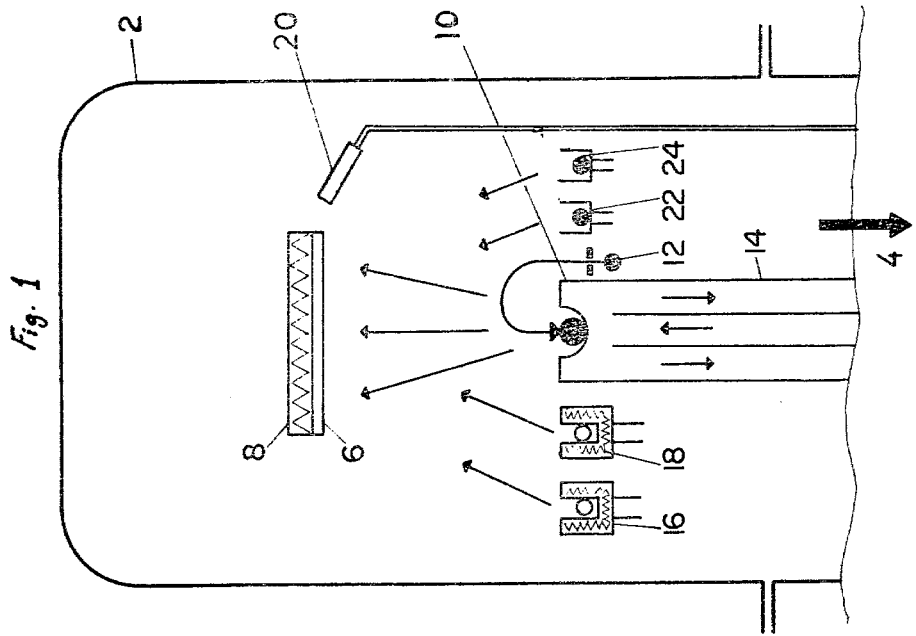
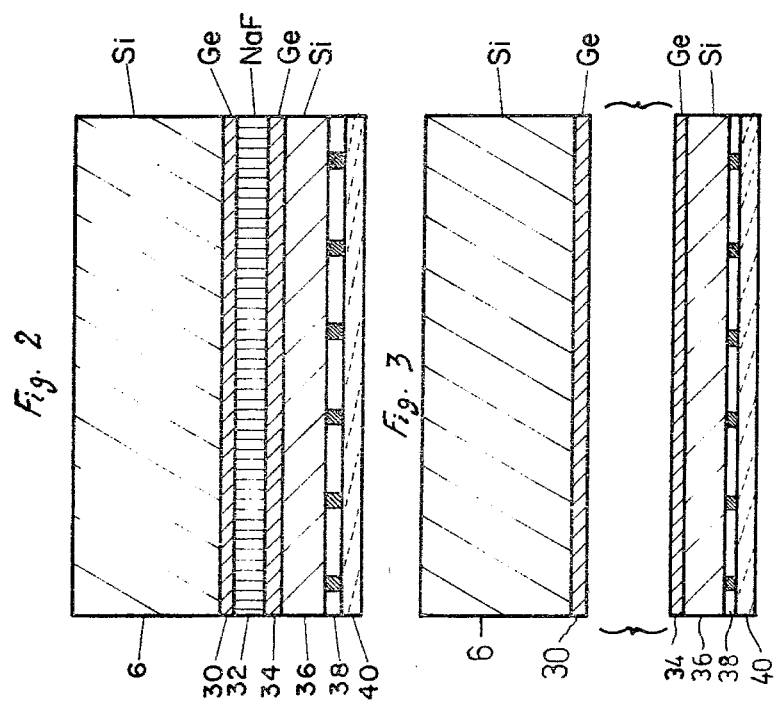

4,255,208

METHOD OF PRODUCING MONOCRYSTALLINE SEMICONDUCTOR FILMS UTILIZING AN INTERMEDIATE WATER DISSOLVABLE SALT LAYER

BACKGROUND OF THE INVENTION

The present invention relates to a method of producing semiconductor films. It is particularly applicable for producing monocrystalline semiconductor films of silicon or germanium, and is therefore described below with respect to such applications.

Monocrystalline films of silicon and germanium are basic materials for the fabrication of photovoltaic solar cells and integrated circuits. In the current state of the technology, the semiconductor crystals are usually produced according to the Czolchvalski technique, wherein the crystals are pulled from the melt and are then sliced into layers which subsequently receive the appropriate treatment for the fabrication of the appropriate junctions, contacts, and the like, according to the specific application. Semiconductor crystal slices produced in this way are expensive because the process is not amenable to automated mass production. In addition, this process requires considerable amounts of energy because of the high temperatures required. Both of the above drawbacks in the present technology are serious limitations to the wide-spread use of such semiconductor films, particularly in large scale solar cell applications where the cost of the semiconductor films is a critical factor.

BRIEF SUMMARY OF THE INVENTION

An object of the present invention is to provide a method of producing semiconductor films, particularly monocrystalline films of silicon and germanium, which process is more amenable to automated mass production and requires less energy than the above-described presently-used processes.

According to a broad aspect of the present invention, there is provided a method of producing semiconductor films, particularly monocrystalline films of silicon and germanium, characterized by the steps of (a) epitaxially-growing on a substrate at least one layer of a salt dissolvable in water; (b) epitaxially-growing on the dissolvable salt a layer of the semiconductor; and (c) dissolving the salt layer with water, thereby separating the semiconductor layer from the substrate.

As known, epitaxial growth is a process in which a layer is deposited on a substrate with the same crystal orientation as exists in the substrate. Thus, if the substrate is of monocrystalline structure, the layer epitaxially-grown thereon will also be of monocrystalline structure. This process is commonly used for extending or modifying the surface of a single crystal structure, e.g., silicon, by the addition of dopants or more silicon for creating circuit elements, the dopants and more silicon being passed over a slice of the silicon substrate in an epitaxial furnace in which the slice is heated. Thus, monolithic integrated circuits are commonly produced according to this technique wherein the circuit elements are applied to a single crystal (e.g., p-type silicon doped with boron) by placing same in a high-temperature epitaxial furnace for growing thereon another silicon layer (e.g., n-type) with the same crystal orientation as the substrate. In producing integrated circuits, the grown layer is covered by a thin coating of silicon dioxide (e.g. by placing the substrate in an oxidizing atmosphere such as steam at high temperature) and then by a masking layer having windows for producing the circuit components.

One of the advantages of the present invention is that the substrate is reusable as a matrix, and therefore its original cost is not a significant factor when used in the mass-production of such films. The growth of the semiconductor layer is effected by evaporation in a high vacuum, at least $10^{-6}$ Torr, in which the substrate need only be moderately heated, while the semiconductor source of evaporation is heated by a low power electron gun. Accordingly, the energy requirements for such a process are considerably less than the present Czolchvalski technique, which is another advantage of the present invention. Further, the semiconductor layers may be deposited at the desired thickness, and impurities can be readily introduced during the deposition. This permits not only very close control of the thickness of the semiconductor film, but also close control of the amount of impurities introduced into it, as well as of the impurity profile of the film, i.e., of the concentration of the impurities with respect to location in the semiconductor. Further, the process is highly amenable to mass production; moreover, it permits a plurality of the semiconductor films to be epitaxially-grown on a substrate with each film separated by an epitaxially-grown dissolvable layer, all the latter layers being dissolved to produce a plurality of separate semiconductor films.

A number of embodiments of the invention are described below for purposes of example. In some described embodiments, the epitaxially-grown semiconductor layer is silicon, in which case it would be preferable to first grow a thin film of germanium on the dissolvable material layer before epitaxially-growing the silicon layer thereover. In the other described embodiments, the epitaxially-grown semiconductor film is germanium.

Further, in some described embodiments, the substrate is silicon, and in such embodiment it is also preferred to first grow a thin film of germanium on the silicon substrate before epitaxially-growing the dissolvable layer thereon since the silicon tends to oxidize. In other described embodiments, the substrate is sapphire, which does not oxidize and which is also stable at high temperatures.

As examples of the material of the dissolvable layer, there may be used sodium fluoride, sodium chloride, or a composite layer including e.g., a film of sodium chloride and an overlying film of silver.

BRIEF DESCRIPTION OF THE DRAWINGS

Further features and advantages of the invention will be apparent by a description of a number of examples taken in conjunction with the annexed drawings, wherein:

FIG. 1 diagrammatically illustrates a known high vacuum system which may be used in the method of the present invention;

FIG. 2 illustrates the various layers epitaxially grown on the substrate in accordance with Example 1 of the method as described below; and FIG. 3 illustrates the semiconductor film produced by the method of Example 1 (and FIG. 2) after it has been separated from the substrate.

DESCRIPTION OF PREFERRED EMBODIMENTS

With reference first to FIG. 1, there is diagrammatically shown a well known high vacuum system commonly used for evaporating thin films. It includes an outer housing 2 in which a high vacuum is produced via a pumping outlet 4. A substrate 6 is supported within the furnace and is heated by an electrical heater 8.

The semiconductor, e.g. silicon or germanium, to be epitaxially grown on the substrate 6 is introduced into a container 10 and is heated by an electron beam generated from a filament 12, such that the semiconductor is evaporated and is deposited on the substrate 6. Cooling of the electron gun is effected by a water-cooling conduit 14.

The apparatus illustrated in FIG. 1 further includes Knudsen cells 16, 18, for evaporating the p-n impurities which are introduced into the semiconductor film as it is epitaxially-grown on the substrate 6. A thickness monitor 20 monitors the thickness of the film.

Such an apparatus is well known, and therefore further details of its construction and operation are available from the literature.

In the present invention, the housing 2 further includes holders or boats 22, 24, for evaporating the material of the dissolvable layer applied between the substrate and the epitaxially-grown semiconductor film. Such holders may also be used for the anti-reflection coating material, and for the electrodes applied to the semiconductor film before the film is separated from the substrate by dissolving the dissolvable layer.

Following is a description of a number of examples of the invention.

EXAMPLE 1 (Si-Ge/NaF/Ge-Si)

In this example, the substrate 6 in FIG. 1 is monocrystalline silicon protected by a thin film of germanium because of the tendency of silicon to oxidize.

First, the silicon substrate 6 is cleaned according to a standard chemical treatment. Then, the entire chamber including the silicon substrate 6 is baked at a temperature of about 200° C. to obtain a vacuum of at least $10^{-6}$ torr, preferably in the order of a few $10^{-8}$ torr. This may require a few hours or up to a day or two, depending on pumping capacity and previous exposure to air. A germanium film 30 (FIG. 2) is then epitaxially-grown on the silicon substrate by being bombarded by the electron beam from gun 12 while the furnace is at a temperature of about 750° C. Preferably, the germanium is evaporated at a rate of the order of 100 Å/min, and to a thickness of about 1,000 Å.

The germanium film 30 is applied to the silicon substrate 6 because of the tendency of silicon to oxidize. Once made, this substrate including the germanium film serves as a reusable matrix for producing many semiconductor films.

A layer 32 (FIG. 2) of a dissolvable material is epitaxially grown on the germanium film 30 of the silicon substrate 6. In this example, the dissolvable layer is sodium fluoride. This material is evaporated at room temperature, at a rate of 100 Å/min, and to a thickness of about 1,000 Å.

Next, a germanium film 34 is epitaxially-grown on the sodium fluoride film 32. This is accomplished at a temperature of about 500° C. to 600° C., at a rate of about 100 Å/min, and to a thickness of about 1,000 Å to 2,000 Å.

Next, the silicon semiconductor layer 36 is epitaxially-grown on the germanium film 34. This is preferably effected at a temperature of about 650° C., and at a rate of 100 Å to a few 1,000 Å/min, to the desired thickness, typically about 2 μm to 20 μm. The epitaxial deposition of the silicon layer 36 is effected by evaporation from the electron source 12. At the same time, the impurities included within cells 16 and 18 may be evaporated at the appropriate rate to obtain the desired impurity-concentration profile, including the p/n junction and desired backfield for lowering of back surface recombination.

Following the application of the silicon layer 36, the contacts 38 and antireflection coating 40 may be evaporated from material contained in the appropriately-provided holders 22, 24.

The substrate 6, including the above-described epitaxially-grown layers thereon, is then removed from the furnace, and the sodium fluoride layer 32 is dissolved in water. This effects the separation of the silicon layer 36 including its germanium film 34, from the matrix 6 including its germanium film 30. As described above, the matrix may then be reused for epitaxially-growing additional semiconductor films.

EXAMPLE 2 (Si-Si/NaF/GeSi)

This example is the same as Example 1 described above, except that the silicon matrix 6 is protected by a silicon film instead of the germanium film 30 (FIG. 2). This silicon film is preferably epitaxially-grown on the silicon matrix 6 by evaporation at a temperature of 750° C., at a rate of 100 Å/min, and to a thickness of about 1,000 Å.

EXAMPLE 3 (Si-Ge/NaCl-Ag/Si)

This example is the same as Example 1 described above, except that instead of using the sodium fluoride dissolvable layer 32, there is used first a layer of sodium chloride and then a layer of silver. The sodium chloride layer is evaporated at a temperature of 250° C.–350° C., at a rate of about 100 Å/min, and to a thickness of a few hundred Å's. The silver is evaporated at a temperature of 250° C.–350° C., at a rate of about 100 Å/min, and to a thickness of about 1,500 Å. In this example 3 the silicon layer 36 is preferably evaporated at a temperature of about 350° C. increasing to about 600° C. during film growth.

The remainder of the procedure is the same as described above in Example 1.

EXAMPLE 4 (GERMANIUM SEMICONDUCTOR FILM)

This example is the same as Example 1 described above, except that instead of growing the silicon layer 36, the underlying germanium film 34 is grown to the desired thickness, typically 2 μm to 20 μm.

EXAMPLE 5 (GERMANIUM-SILICON COMPOSITE FILM)

This example may follow Examples 1 and 2 above, except that the final layers of germanium 34 and silicon 36 are of about equal thickness, namely the thickness of the silicon layer 36, to provide a double gap for better spectral efficiency.

EXAMPLE 6 (SAPPHIRE/Ag/Si)

In this example, the substrate (layers 6, 30 in FIG. 2) is of sapphire, which may be cleaned according to any standard chemical treatment, and then baked as described in Example 1. In addition, the dissolvable layer (32 in FIG. 2) is silver, which may be applied by evaporation at a temperature of 350° C., at a rate of about 100 Å/min, and to a thickness of about 1,500 Å. The remainder of the procedure is the same as described above in Example 1, except that the dissolvable layer of silver is dissolvable in nitric acid.

It will be appreciated that, while the above examples describe only the application of one semiconductor film, a plurality of the semiconductor films may be epitaxially-grown on the common substrate, with each film separated by an epitaxially-grown dissolvable layer. After the plurality of layers have been grown, the substrate including the alternating layers of semiconductor may then be treated in the solvent so as to dissolve all the dissolvable layers at one time and thereby to produce a plurality of semiconductor films.

While the invention has been described with respect to several preferred embodiments, it will be appreciated that these are described purely for purposes of example, and that many other variations, modifications and applications of the invention may be made.

What is claimed is:

1. A method of producing monocrystalline semiconductor films, characterized by the steps of:
   (a) epitaxially growing on a substrate at least one layer of a salt dissolvable in water;
   (b) epitaxially growing on said salt layer a layer of the monocrystalline semiconductor; and
   (c) dissolving said salt layer with water, thereby separating the monocrystalline semiconductor layer from the substrate.

2. The method according to claim 1, wherein a monocrystalline semi-conductor of one type is epitaxially grown on said salt layer, and then a monocrystalline semiconductor of another type is epitaxially grown on said latter layer before the salt layer is dissolved with water.

3. The method according to claim 2, wherein said epitaxially-grown layers are grown by evaporation in a high vacuum of at least $10^6$ torr.

4. The method according to claim 1, wherein the epitaxially-grown semiconductor layer is silicon.

5. The method according to claim 4, wherein a thin film of germanium is epitaxially grown on the dissolvable salt layer before epitaxially growing the silicon layer thereon.

6. The method according to claim 1, wherein the epitaxially-grown semiconductor is germanium.

7. The method according to claim 1, wherein the substrate is silicon.

8. The method according to claim 7, wherein a thin film of germanium is epitaxially grown on the silicon substrate before epitaxially growing the dissolvable layer thereon.

9. The method according to claim 1, wherein the substrate is sapphire.

10. The method according to claim 1, wherein the dissolvable layer includes a film of sodium fluoride.

11. The method according to claim 1, wherein the dissolvable layer includes a film of sodium chloride.

12. The method according to claim 11, wherein the dissolvable layer further includes an overlying film of silver.

13. The method according to claim 2, wherein the semiconductor layer of one type is germanium and the semiconductor layer of the other type is silicon.

14. The method according to claim 1, wherein the dissolvable layer includes a film of silver.

15. The method according to claim 4, wherein a layer of germanium is epitaxially grown on the dissolvable layer before epitaxially growing the silicon layer thereon, and of a thickness substantially equal to said silicon layer.

16. The method according to claim 1, wherein electrical contacts are evaporated on the epitaxially-grown semiconductor layer before the dissolvable layer is dissolved.

17. The method according to claim 1, wherein an antireflective coating is evaporated on the epitaxially-grown semiconductor layer before the dissolvable layer is dissolved.

18. The method according to claim 1, wherein a plurality of semiconductor layers are epitaxially-grown on a common substrate with each layer being separated by an epitaxially-grown layer of dissolvable material, all said latter layers being dissolved at one time to produce a plurality of separate semiconductor films.

* * * * *